(12) United States Patent
Hossain et al.

(10) Patent No.: US 9,035,194 B2
(45) Date of Patent: May 19, 2015

(54) CIRCUIT BOARD WITH INTEGRATED PASSIVE DEVICES

(71) Applicant: INTEL CORPORATION, Santa Clara, CA (US)

(72) Inventors: M D Altaf Hossain, Portland, OR (US); Jin Zhao, San Jose, CA (US); John T. Vu, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 213 days.

(21) Appl. No.: 13/664,264

(22) Filed: Oct. 30, 2012

(65) Prior Publication Data
US 2014/0116765 A1    May 1, 2014

(51) Int. Cl.
*H05K 1/16*    (2006.01)
*H05K 1/11*    (2006.01)

(52) U.S. Cl.
CPC ...... *H05K 1/162* (2013.01); *H01L 2224/16225* (2013.01); *H01L 2924/15311* (2013.01); *H05K 1/113* (2013.01); *H05K 1/165* (2013.01); *H05K 1/167* (2013.01); *H05K 2201/09709* (2013.01); *H05K 2201/10734* (2013.01)

(58) Field of Classification Search
USPC .................. 174/260, 255, 258, 262; 361/302, 361/306.1, 760–764, 767, 768, 780, 782, 361/783; 257/531, 532, 678, 693, 700, 728, 257/737, 758, 774, 778; 333/12, 181
See application file for complete search history.

(56) References Cited

U.S. PATENT DOCUMENTS

| | | | |
|---|---|---|---|
| 5,351,167 A | 9/1994 | Wai et al. | |
| 5,805,431 A | 9/1998 | Joshi et al. | |
| 6,091,310 A * | 7/2000 | Utsumi et al. | 333/12 |
| 6,108,212 A * | 8/2000 | Lach et al. | 361/768 |
| 6,367,143 B1 | 4/2002 | Suimura | |
| 6,445,271 B1 | 9/2002 | Johnson | |

(Continued)

FOREIGN PATENT DOCUMENTS

KR    1020120083862 A    7/2012

OTHER PUBLICATIONS

International Search Report and Written Opinion in related matter PCT/US2013/066654, mailed Feb. 25, 2014.

(Continued)

*Primary Examiner* — Xiaoliang Chen
(74) *Attorney, Agent, or Firm* — Schwabe, Williamson & Wyatt, P.C.

(57) ABSTRACT

Embodiments of the present disclosure are directed towards a circuit board having integrated passive devices such as inductors, capacitors, resistors and associated techniques and configurations. In one embodiment, an apparatus includes a circuit board having a first surface and a second surface opposite to the first surface and a passive device integral to the circuit board, the passive device having an input terminal configured to couple with electrical power of a die, an output terminal electrically coupled with the input terminal, and electrical routing features disposed between the first surface and the second surface of the circuit board and coupled with the input terminal and the output terminal to route the electrical power between the input terminal and the output terminal, wherein the input terminal includes a surface configured to receive a solder ball connection of a package assembly including the die. Other embodiments may be described and/or claimed.

19 Claims, 4 Drawing Sheets

(56) References Cited

U.S. PATENT DOCUMENTS

| | | | |
|---|---|---|---|
| 6,556,420 B1* | 4/2003 | Naito et al. | 361/306.1 |
| 6,775,150 B1* | 8/2004 | Chakravorty et al. | 361/761 |
| 6,952,049 B1* | 10/2005 | Ogawa et al. | 257/700 |
| 7,209,011 B2* | 4/2007 | Welland et al. | 331/36 L |
| 7,345,563 B2* | 3/2008 | Pavier | 336/200 |
| 7,768,370 B2 | 8/2010 | Brown | |
| 8,166,447 B1* | 4/2012 | Smith et al. | 716/136 |
| 8,178,435 B2* | 5/2012 | Lin | 438/622 |
| 8,274,330 B2* | 9/2012 | Paul et al. | 330/252 |
| 8,487,400 B2* | 7/2013 | Lin | 257/508 |
| 2002/0070423 A1* | 6/2002 | Takafuji | 257/532 |
| 2002/0140538 A1 | 10/2002 | Yer et al. | |
| 2002/0163396 A1* | 11/2002 | Lim et al. | 331/179 |
| 2002/0172025 A1* | 11/2002 | Megahed et al. | 361/767 |
| 2002/0191366 A1* | 12/2002 | Naito et al. | 361/302 |
| 2003/0116843 A1* | 6/2003 | Iijima et al. | 257/700 |
| 2003/0116857 A1* | 6/2003 | Taniguchi et al. | 257/774 |
| 2003/0142460 A1* | 7/2003 | Naito et al. | 361/306.1 |
| 2004/0041270 A1* | 3/2004 | Shimizu et al. | 257/758 |
| 2004/0125579 A1* | 7/2004 | Konishi et al. | 361/783 |
| 2004/0140553 A1* | 7/2004 | Naito et al. | 257/700 |
| 2004/0238942 A1* | 12/2004 | Chakravorty et al. | 257/700 |
| 2005/0087850 A1* | 4/2005 | Nishikawa et al. | 257/678 |
| 2005/0208705 A1* | 9/2005 | Iijima et al. | 438/108 |
| 2005/0242897 A1* | 11/2005 | Lim et al. | 331/179 |
| 2005/0258548 A1* | 11/2005 | Ogawa et al. | 257/778 |
| 2005/0263874 A1* | 12/2005 | Shimizu et al. | 257/700 |
| 2006/0109071 A1 | 5/2006 | Thongsouk et al. | |
| 2006/0145800 A1 | 7/2006 | Dadafshar et al. | |
| 2006/0171130 A1* | 8/2006 | Konishi et al. | 361/760 |
| 2006/0193105 A1* | 8/2006 | Sakata et al. | 361/528 |
| 2006/0279940 A1* | 12/2006 | Chakravorty et al. | 361/763 |
| 2006/0291177 A1* | 12/2006 | Choi et al. | 361/780 |
| 2007/0035020 A1* | 2/2007 | Umemoto | 257/737 |
| 2007/0076392 A1* | 4/2007 | Urashima et al. | 361/763 |
| 2007/0210866 A1* | 9/2007 | Sato et al. | 330/126 |
| 2007/0216020 A1* | 9/2007 | Shiraishi | 257/700 |
| 2007/0258225 A1* | 11/2007 | Inagaki et al. | 361/763 |
| 2007/0285907 A1* | 12/2007 | Nishikawa et al. | 361/763 |
| 2008/0002380 A1* | 1/2008 | Hazucha et al. | 361/760 |
| 2008/0029886 A1* | 2/2008 | Cotte et al. | 257/728 |
| 2008/0079118 A1 | 4/2008 | Bang et al. | |
| 2008/0157897 A1* | 7/2008 | Tilmans et al. | 333/105 |
| 2008/0169120 A1* | 7/2008 | Inagaki et al. | 174/255 |
| 2008/0186247 A1* | 8/2008 | Cotte et al. | 343/841 |
| 2008/0204971 A1* | 8/2008 | Lee et al. | 361/306.3 |
| 2009/0153421 A1* | 6/2009 | Rofougaran et al. | 343/745 |
| 2009/0160595 A1* | 6/2009 | Feng et al. | 336/200 |
| 2009/0268418 A1* | 10/2009 | Choi et al. | 361/764 |
| 2009/0268419 A1* | 10/2009 | Choi et al. | 361/767 |
| 2010/0109052 A1* | 5/2010 | Nakajima et al. | 257/197 |
| 2010/0178879 A1* | 7/2010 | Sato et al. | 455/78 |
| 2010/0226108 A1* | 9/2010 | Inagaki et al. | 361/762 |
| 2011/0031610 A1* | 2/2011 | Yamazaki et al. | 257/693 |
| 2011/0155433 A1* | 6/2011 | Funaya et al. | 174/258 |
| 2011/0169164 A1* | 7/2011 | Nakamura et al. | 257/739 |
| 2011/0222255 A1* | 9/2011 | Kitano et al. | 361/782 |
| 2011/0294265 A1* | 12/2011 | Shioga et al. | 438/118 |
| 2012/0075216 A1* | 3/2012 | Black et al. | 345/173 |
| 2012/0098089 A1* | 4/2012 | Tago | 257/531 |
| 2012/0241906 A1* | 9/2012 | Nakanishi | 257/532 |
| 2012/0306608 A1* | 12/2012 | Takenaka | 336/200 |
| 2012/0314389 A1* | 12/2012 | Takenaka | 361/761 |
| 2013/0015871 A1* | 1/2013 | Cleary et al. | 324/754.03 |
| 2013/0020675 A1* | 1/2013 | Kireev et al. | 257/531 |

OTHER PUBLICATIONS

U.S. Appl. No. 13/715,016, filed Dec. 14, 2012.

* cited by examiner

CIRCUIT BOARD WITH INTEGRATED PASSIVE DEVICES

FIELD

Embodiments of the present disclosure generally relate to the field of integrated circuits, and more particularly, to a circuit board having integrated passive devices such as inductors, capacitors, resistors and associated techniques and configurations.

BACKGROUND

Presently, passive devices such as inductors, capacitors, and resistors are separately fabricated from a circuit board and mounted as discrete components on the circuit board using techniques such as, for example, Surface Mount Technology (SMT) subsequent to fabrication of the circuit board. However, such passive devices may be disposed on an area of the circuit board that may otherwise be used to accommodate active devices (e.g., die or dies) for emerging thin form factor designs. The circuit board configured for surface-mounted passive devices may also have a larger size to accommodate the surface-mounted passive devices. Further, discrete passive devices may consume too much power and, thus, reduce battery life of a computing device.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe a circuit board having integrated passive devices such as inductors, capacitors, resistors and associated techniques and configurations. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Figure 1:
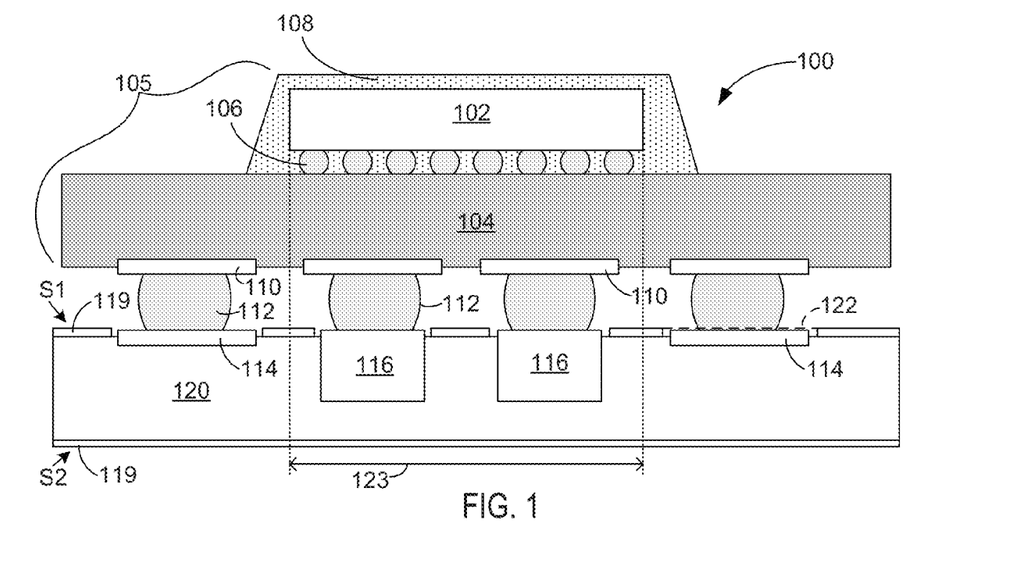
FIG. 1 schematically illustrates a cross-section side view of an example integrated circuit (IC) package assembly, in accordance with some embodiments.

FIG. 1 schematically illustrates a cross-section side view of an example integrated circuit (IC) package assembly 100, in accordance with some embodiments. The IC package assembly 100 includes a die package assembly 105 including a package substrate 104 having one or more dies (hereinafter "die 102") mounted on the package substrate 104 and a circuit board 120 coupled with the die package assembly 105, as can be seen.

The die 102 can be attached to the package substrate 104 according to a variety of suitable configurations including, a flip-chip configuration, as depicted, or other configurations such as wirebonding and the like. In the flip-chip configuration, an active side of the die 102 is attached to a surface of the package substrate 104 using die interconnect structures 106 such as bumps, pillars, or other suitable structures. The active side of the die 102 may have one or more transistor devices formed thereon. The die 102 may represent a discrete chip and may be, include, or be a part of a processor, memory, or ASIC in some embodiments. In some embodiments, an encapsulant 108 such as, for example, molding compound or underfill material may fully or partially encapsulate the die 102.

The die interconnect structures 106 may be configured to route electrical signals between the die 102 and the package substrate 104. In some embodiments, the electrical signals may include, for example, input/output (I/O) signals and/or power or ground signals associated with the operation of the die 102.

The package substrate 104 may include structures configured to route electrical signals to or from the die 102. The structures may include, for example, traces (not shown) disposed on one or more surfaces of the package substrate 104 and/or internal such as, for example, trenches, vias or other interconnect structures (not shown) to route electrical signals through the package substrate 104. For example, in some embodiments, the package substrate 104 may include structures such as die bond pads (not shown) configured to receive the die interconnect structures 106 and route electrical signals between the die 102 and the package substrate 104.

In some embodiments, the package substrate 104 is an epoxy-based laminate substrate having a core and/or build-up layers such as, for example, an Ajinomoto Build-up Film (ABF) substrate. The package substrate 104 may include other suitable types of substrates in other embodiments including, for example, substrates formed from glass, ceramic, or semiconductor materials.

Package level interconnects including solder material such as, for example, solder balls 112 may be coupled to one or more pads (hereinafter "pads 110") on the package substrate 104 and/or one or more pads (hereinafter "pads 114") on circuit board to form corresponding solder joints that are configured to further route the electrical signals of the die 102 to the circuit board 120.

In some embodiments, the circuit board 120 may be a printed circuit board (PCB) composed of an electrically insulative material such as an epoxy laminate. For example, the circuit board 120 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures (not shown) such as traces, trenches, vias may be formed through the electrically insulating layers to route the electrical signals of the die 102 through the circuit board 120. The circuit board 120 may be composed of other suitable materials in other embodiments.

Only a portion of the circuit board 120 may be depicted in FIG. 1. The circuit board 120 may include other electrical devices coupled to the circuit board that are configured to route electrical signals to or from the die 102 through the circuit board 120. The circuit board 120 may be a motherboard (e.g., motherboard 602 of FIG. 6) in some embodiments.

According to various embodiments, the circuit board 120 may include one or more passive devices (hereinafter "passive devices 116") integral to the circuit board 120. The passive devices 116 may be integrally formed using fabrication processes that form the circuit board (e.g., lamination, deposition, patterning, drilling, etc.) and may, thus, be an integral part of the circuit board 120. In some embodiments, the passive devices 116 include one or more of inductors, capacitors, resistors, and the like.

The passive devices 116 may be formed in a region of the circuit board 120 that is within a shadow of the die 102, as indicated by dashed lines at the ends of arrow 123. The region in the die shadow may be used for power delivery components of the die 102 such as for the passive devices 116 in some embodiments.

The circuit board 120 may include a first surface S1 and a second surface S2 opposite to the first surface S1, as can be seen. In some embodiments, the first surface S1 and/or the second surface S2 includes a solder resist layer 119 formed to protect surfaces of the circuit board 120 that do not form solder connections with the solder balls 112. Openings such as opening 122 may be formed or otherwise provided in the solder resist layer 119 to expose surfaces of the pads 114 and passive devices 116 to allow formation of solder connections with the solder balls 112.

Figure 2:
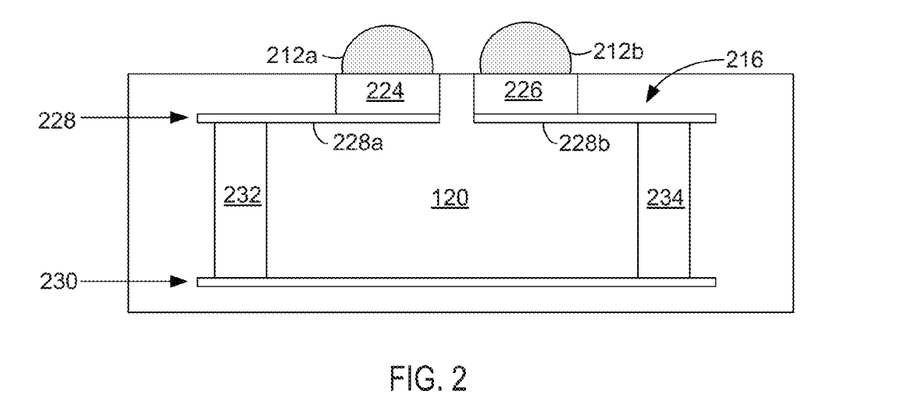
FIG. 2 schematically illustrates a cross-section side view of a portion of the circuit board having a passive device integral to the circuit board, in accordance with some embodiments.

FIG. 2 schematically illustrates a cross-section side view of a portion of the circuit board 120 having a passive device 216 integral to the circuit board 120, in accordance with some embodiments. The passive device 216 and solder balls 212a-b may comport with embodiments described in connection with respective passive devices 116 and solder balls 112 of FIG. 1 and vice versa.

According to various embodiments, the passive device 216 may include an input terminal 224 configured to receive electrical signals such as power and/or ground signals of a die (e.g., die 102 of FIG. 1) through the solder ball 212a. The power and/or ground signals may hereafter be referred to as "electrical power." The input terminal 224 may be coupled with electrical power of the die. The input terminal 224 may, for example, include a surface configured to receive a solder ball 212a of a die package assembly (e.g., die package assembly 105 of FIG. 1) including the die. The passive device 216 may further include an output terminal 226 electrically coupled with the input terminal 224 by electrical routing features. In some embodiments, the output terminal 224 may include a surface configured to receive a solder ball 212b of the die package assembly. In some embodiments, the electrical routing features are disposed between a first surface (e.g., S1 of FIG. 1) and a second surface (e.g., S2 of FIG. 1) of the circuit board 120 and coupled with the input terminal 224 and the output terminal 226 to route the electrical power between the input terminal 224 and the output terminal 226.

In the depicted embodiment, the electrical routing features of the passive device 216 include input portion 228a and output portion 228b of a first layer 228, second layer 230, first via structure (hereinafter "first via 232") and second via structure (hereinafter "second via 234"), coupled as can be seen. The input portion 228a of the first layer 228 may be electrically insulated (e.g., by electrically insulative material of circuit board 120) from the output portion 228b of the first layer 228 in a plane of the first layer 228 as can be seen. In some embodiments, the first layer 228 is a surface layer of the circuit board 120 meaning that the first layer 228 may be an outermost conductive layer or a conductive layer that is nearest a terminating insulating surface (e.g., solder resist layer 119 of FIG. 1) of the circuit board. The first via 232 and second via 234 may include, for example, plated through-holes (PTHs) or high-density interconnect (HDI) structures. Features of the passive device 216 may pass through electrically insulative material of the circuit board 120 and may be composed of a metal such as, for example, copper (Cu) or aluminum (Al), but is not limited to these example materials and may include any suitable electrically conductive material in various embodiments.

In some embodiments, the input terminal 224 and the output terminal may represent respective solder pads of variable thickness formed using one or more metal layers (e.g., other than copper) upon which the solder balls 212a and 212b are bonded. In other embodiments, the input terminal 224 and the output terminal 226 may be formed using solderable material or may represent solder balls themselves. In other words, the passive device 216 may not include input terminal 224 and the output terminal 226 in some embodiments and the solder balls 212a and 212b may be bonded to the respective input portion 228a and output portion 228b of the first layer 228, which may serve as solder pads in some embodiments. In this regard, the solder balls 212a and 212b may serve as the respective input terminal 224 and the output terminal 226 of the passive device 216 in some embodiments. Openings may be formed in the material of the circuit board 120 to allow bonding of the solder balls 212a and 212b to the respective input terminal 224 and output terminal 226 or to the respective first portion 228a and second portion 228b of first layer 228. According to various embodiments, the input terminal 224 may function as described for the output terminal 226 and the output terminal 226 may function as described for the input terminal 224.

In some embodiments, the passive device 216 is an inductor. For example, the electrical routing features (e.g., first layer 228, input portion 228a, output portion 228b, second layer 230, first via 232 and second via 234) may be configured, as can be seen, to route the electrical power of the die between the input terminal 224 and the output terminal 226 by inductive coupling. The electrical routing features may form one or more inductive loops or coils of an inductor.

Dimensions of the electrical routing features such as, for example, lengths and/or heights of input portion 228a and output portion 228b of the first layer, the second layer 230, and the first via 232 and second via 234 may be designed or configured to provide a desired inductance. For example, increasing an area of the loop may increase inductance of the inductor and decreasing an area of the loop may decrease inductance of the inductor. In some embodiments, additional layers of electrically conductive material may be coupled to the first via 232 and second via 234 between the first layer 228 and the second layer 230. Providing the additional layers may reduce inductance (e.g., both DC and AC) of the passive device 216. Providing passive devices 116 such as inductors that are integral to the circuit board 120 as described herein may increase power efficiency by about 2-3% relative to discrete inductors that are surface mounted on the PCB after assembly of the circuit board, which may result in less consumption of power and associated benefits.

In some embodiments, the passive device 216 is a resistor. The output terminal 226 may be resistively coupled with the input terminal 224. For example, the electrical routing features (e.g., first layer 228, input portion 228a, output portion 228b, second layer 230, first via 232 and second via 234) may be configured, as can be seen, to route the electrical power of the die between the input terminal 224 and the output terminal 226 by resistive coupling. In an embodiment, the input terminal 224 may be connected to a solder ball 212a and the output terminal 226 may be connected to solder ball 212b.

Dimensions of the electrical routing features such as, for example, lengths and/or heights of input portion 228a and output portion 228b of the first layer 228, the second layer 230, and the first via 232 and second via 234 may be designed or configured to provide a desired resistance through the resistor. For example, increasing an area of the loop may increase resistance of the resistor and decreasing an area of the loop may decrease resistance of the resistor. In some embodiments, additional layers of electrically conductive material may be coupled to the first via 232 and second via 234 between the first layer 228 and the second layer 230. The additional layers may reduce resistance of the passive device 216.

In some embodiments, the passive device 216 is a capacitor. The output terminal 226 may be capacitively coupled with the input terminal 224. For example, the electrical routing features (e.g., first layer 228, input portion 228a, output portion 228b, second layer 230, first via 232 and second via 234) may be configured, as can be seen, to route the electrical power of the die between the input terminal 224 and the output terminal 226 by capacitive coupling. A thin layer of dielectric material may be disposed between one or more of the electrical routing features to provide capacitive coupling across the dielectric material between the input terminal 224 and output terminal 226. For example, the input portion 228a of the first layer 228 may serve as a first plate of a capacitor and an overlapping portion of the second layer 230 may serve as a second plate of the capacitor. The first via 232 may be replaced with a dielectric material such that a height of the second via 234 may define a distance between the first layer 228 and the second layer 230. The input terminal 224 may be connected to a solder ball 212a and the output terminal 226 may be connected to solder ball 212b.

Dimensions of the electrical routing features may be designed or configured to provide a desired capacitance through the capacitor. For example, increasing an area of a first plate and second plate corresponding with the first layer 228 and the second layer 230 and/or decreasing a distance between the first plate and second plate may increase capacitance of the capacitor.

Figure 3:
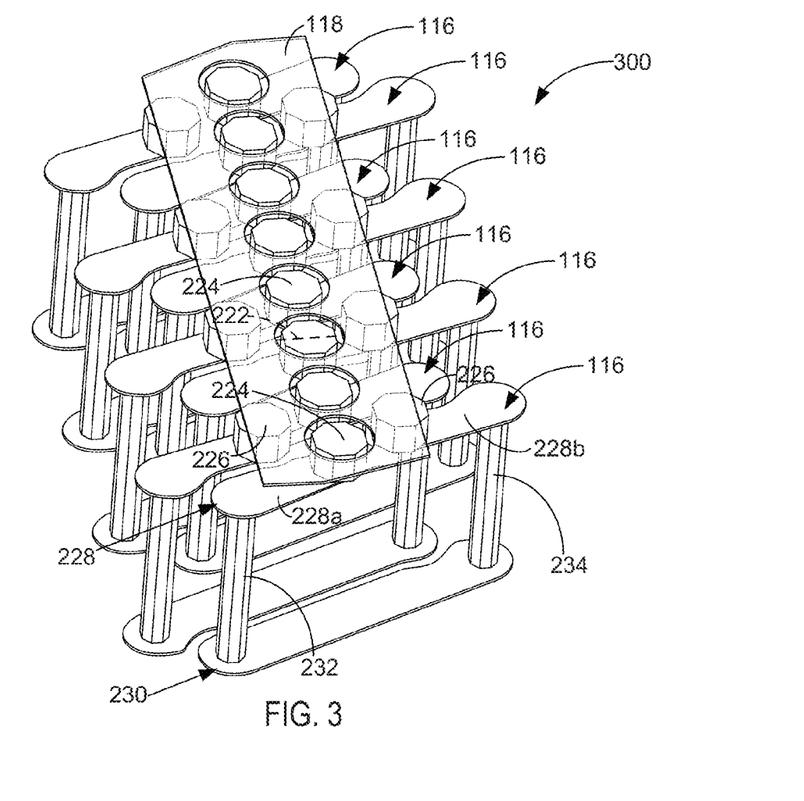
FIG. 3 schematically illustrates a perspective view of a configuration of passive devices integral to a circuit board, in accordance with some embodiments.

FIG. 3 schematically illustrates a perspective view of a configuration 300 of passive devices 116 integral to a circuit board (e.g., circuit board 120 of FIG. 1), in accordance with some embodiments. Material of the circuit board other than the passive devices 116 is not depicted to avoid obscuring aspects of the configuration 300. The passive devices 116 may comport with embodiments described in connection with passive devices 116 of FIG. 1 and passive device 216 of FIG. 2, and vice versa.

In the depicted embodiment, each of the passive devices 116 is configured with an input portion 228a of a first layer 228 coupled with an input terminal 224, an output portion 228b of the first layer 228 coupled with an output terminal 226 of the first layer 228, and a second layer 230 electrically coupled with the input portion 228a and the output portion 228b by a respective first via 232 and second via 234.

In the configuration 300, pairs of the passive devices 116 are coupled in a staggered manner such that the input terminals (e.g., input terminal 224) of the passive devices 116 are configured in a row and output terminals are disposed in an alternating manner on both sides of the row, as can be seen. The input portion 228a and the output portion 228b of the first layer 228 and the second layer 230 may be configured as plate structures, as can be seen. The plate structures of the passive devices 116 may be configured with shapes that mate or otherwise facilitate close-proximity placement of the passive devices 116 in the alternating, staggered arrangement, as can be seen.

In some embodiments, a conductive layer 118 of a die package assembly (e.g., package substrate 104 of FIG. 1) may be electrically coupled with the output terminal 224 of the passive devices 116, as can be seen. Openings such as opening 222 may be formed in the conductive layer 118 to allow connection of the input terminal 224 of the passive devices 116 to features of the die package assembly that are configured to route electrical power of the die. In other embodiments, the passive devices 116 may be configured in other arrangements and/or openings (e.g., opening 122) may be formed in the conductive layer 118 to expose surfaces of the output terminal 226 of the passive devices 116 as depicted, for example, in connection with FIG. 4.

In some embodiments, the conductive layer 118 may have solder balls electrically coupled (e.g., bonded) with the conductive layer 118, where the solder balls are configured to function as the output terminal 226 of the passive devices. In such embodiment, the input terminal 224 of the passive devices 116 may include other solder balls attached to features of the die package assembly through openings (e.g., opening 222) in the conductive layer 118.

Including passive devices 116 integral to the circuit board may simplify a design and/or qualification process of the circuit board. For example, in some embodiments, configuration 300 may represent an example modular design. A same modular design (e.g., configuration 300) may be used in many different circuit board designs (e.g., for different customers). The ability to re-use the modular design may simplify the design and/or qualification process resulting in a reduced a cost of design and time for qualification of the circuit board.

Figure 4:
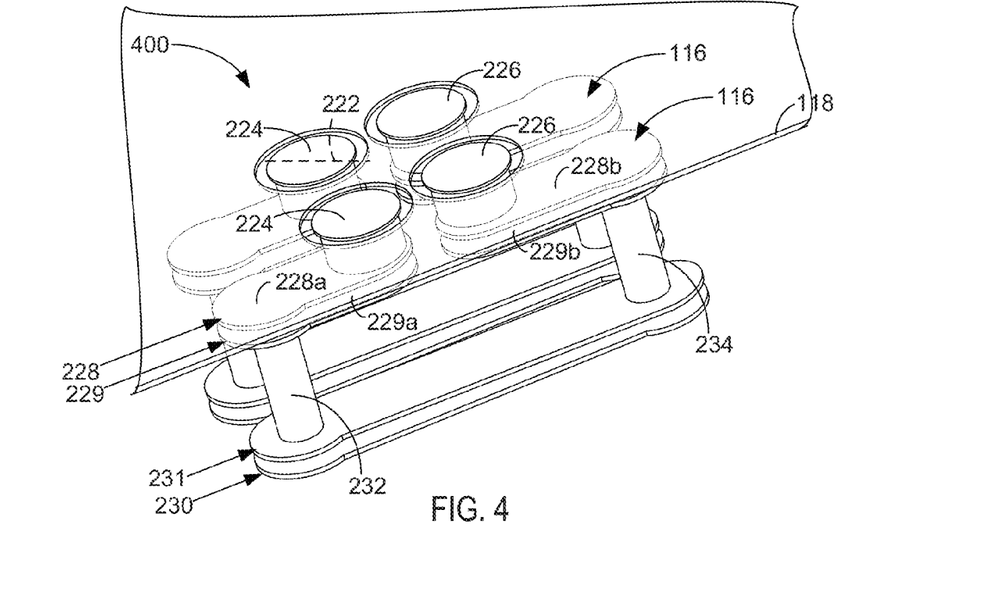
FIG. 4 schematically illustrates a perspective view of a configuration of passive devices integral to a circuit board, in accordance with some embodiments.

FIG. 4 schematically illustrates a perspective view of a configuration 400 of passive devices 116 integral to a circuit board (e.g., circuit board 120 of FIG. 1), in accordance with some embodiments. Material of the circuit board other than the passive devices is not depicted to avoid obscuring aspects of the configuration 400. The passive devices 116 may comport with embodiments described in connection with passive devices 116 of FIG. 1, passive device 216 of FIG. 2, passive devices 116 of FIG. 3, and vice versa.

In the depicted embodiment, each of the passive devices 116 is configured with an input portion 228a of a first layer 228 coupled with an input terminal 224, an output portion 228b of the first layer 228 coupled with an output terminal 226 of the first layer 228, and a second layer 230 electrically coupled with the input portion 228a and the output portion 228b by a respective first via 232 and second via 234. Each of the passive devices 116 may further include one or more additional layers disposed between the first layer 228 and the second layer 230.

For example, in some embodiments, the passive devices 116 may include a third layer 229 having an input portion 229a coupled with the input terminal 224 and the first via 232 and an output portion 229b coupled with the output terminal 226 and the second via 234, as can be seen. The passive devices 116 may further include a fourth layer 231 coupled with the first via 232 and the second via 234. The fourth layer 231 may be electrically coupled with the input portion 228a of the first layer 228 by the first via 232 and electrically coupled with the output portion 228b of the first layer 228 by the second via 234. In some embodiments, the first layer 228, the second layer 230, the third layer 229 and the fourth layer 231 may be substantially planar and parallel relative to one another. In embodiments where the passive devices 116 are configured to operate as inductors and/or resistors, the additional layers (e.g., third layer 229 and fourth layer 231) may respectively decrease inductance and/or resistance.

Figure 5:
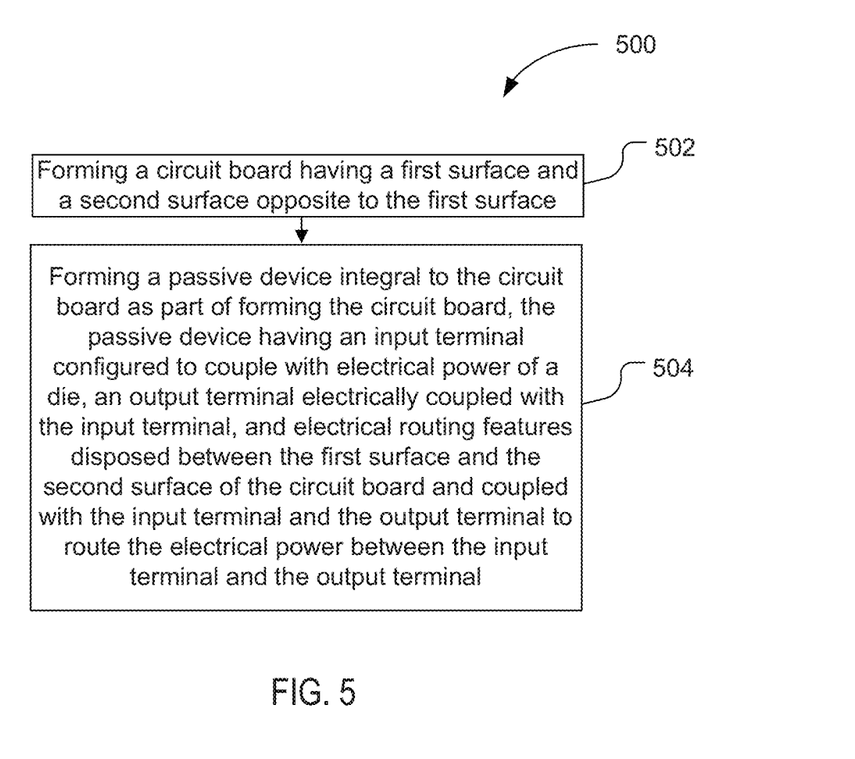
FIG. 5 schematically illustrates a flow diagram for a method of fabricating a passive device integral to a circuit board, in accordance with some embodiments.

FIG. 5 schematically illustrates a flow diagram for a method 500 of fabricating a passive device integral to a circuit board, in accordance with some embodiments. The method 500 may comport with embodiments described in connection with FIGS. 1-4.

At 502, the method 500 includes forming a circuit board (e.g., circuit board 120 of FIG. 1) having a first surface (e.g., S1 of FIG. 1) and a second surface (e.g., S2 of FIG. 1) opposite to the first surface. The circuit board may be formed using techniques such as, for example, lamination of electrically insulative materials, deposition of electrically conductive materials, patterning of the electrically conductive materials by additive or subtractive processes, creating holes or vias by mechanical means, laser drilling or etch processes, the like, and other techniques.

At 504, the method further includes forming a passive device (e.g., passive devices 116 of FIGS. 1, 3-4 or passive device 216 of FIG. 2) integral to the circuit board as part of forming the circuit board, the passive device including an input terminal (e.g., input terminal 224 of FIGS. 2-4) configured to couple with electrical power of a die (e.g., die 102 of FIG. 1), an output terminal (e.g., output terminal 226 of FIGS. 2-4) electrically coupled with the input terminal, and electrical routing features (e.g., first layer 228, input portion 228a, output portion 228b, second layer 230, first via 232 and second via 234 of FIGS. 2-4) disposed between the first surface and the second surface of the circuit board and coupled with the input terminal and the output terminal to route the electrical power between the input terminal and the output terminal. The passive device may be formed using techniques that are used to form the circuit board including, for example, lamination of electrically insulative materials, deposition of electrically conductive materials, patterning of the electrically conductive materials by additive or subtractive processes, creating holes or vias by mechanical means, laser drilling or etch processes, the like, and other suitable techniques. In some embodiments, multiple passive devices are formed integral to the circuit board according to techniques described in connection for the passive device.

In some embodiments, integrally forming the passive device at 504 includes forming the electrical routing features by forming a first via through electrically insulative material of the circuit board and forming a second via through the electrically insulative material of the circuit board. The first via and the second via may be formed, for example, using drilling (e.g., laser or mechanical) or etch processes. In some embodiments, the first via and the second via may be formed using plated through-hole techniques.

Integrally forming the passive device at 504 may further include forming the electrical features by forming a first layer having an input portion and an output portion. The input portion may be coupled with the first via and the output portion may be coupled with the second via. In some embodiments, the input portion is formed to be electrically insulated from the output portion in a plane of the first layer. Integrally forming the passive device at 504 may further include forming the input terminal on the input portion of the first layer and forming the output terminal on the output portion of the first layer.

Integrally forming the passive device at 504 may further include forming the electrical routing features by forming a second layer that is electrically coupled with the input portion of the first layer by the first via and electrically coupled with the output portion of the first layer by the second via. Forming the electrically routing features may further include forming one or more additional layers disposed between the first layer and the second layer. The one or more additional layers may be electrically coupled with the input portion of the first layer by the first via and electrically coupled with the output portion of the first layer by the second via.

According to various embodiments, the electrical routing features may be formed to provide features that are configured to route the electrical power between the input terminal and the output terminal by inductive coupling, resistive coupling, or capacitive coupling, or suitable combinations thereof, to provide a passive device that operates as an inductor, resistor, or capacitor, or suitable combinations thereof.

In some embodiments, forming the circuit board at 502 may further include forming a solder resist layer (e.g., solder resist layer 119 of FIG. 1). The solder resist layer may have one or more openings formed therein to expose the input terminal and/or the output terminal of the passive device. The solder resist layer may be deposited subsequent to forming the passive device at 504, in some embodiments.

Figure 6:
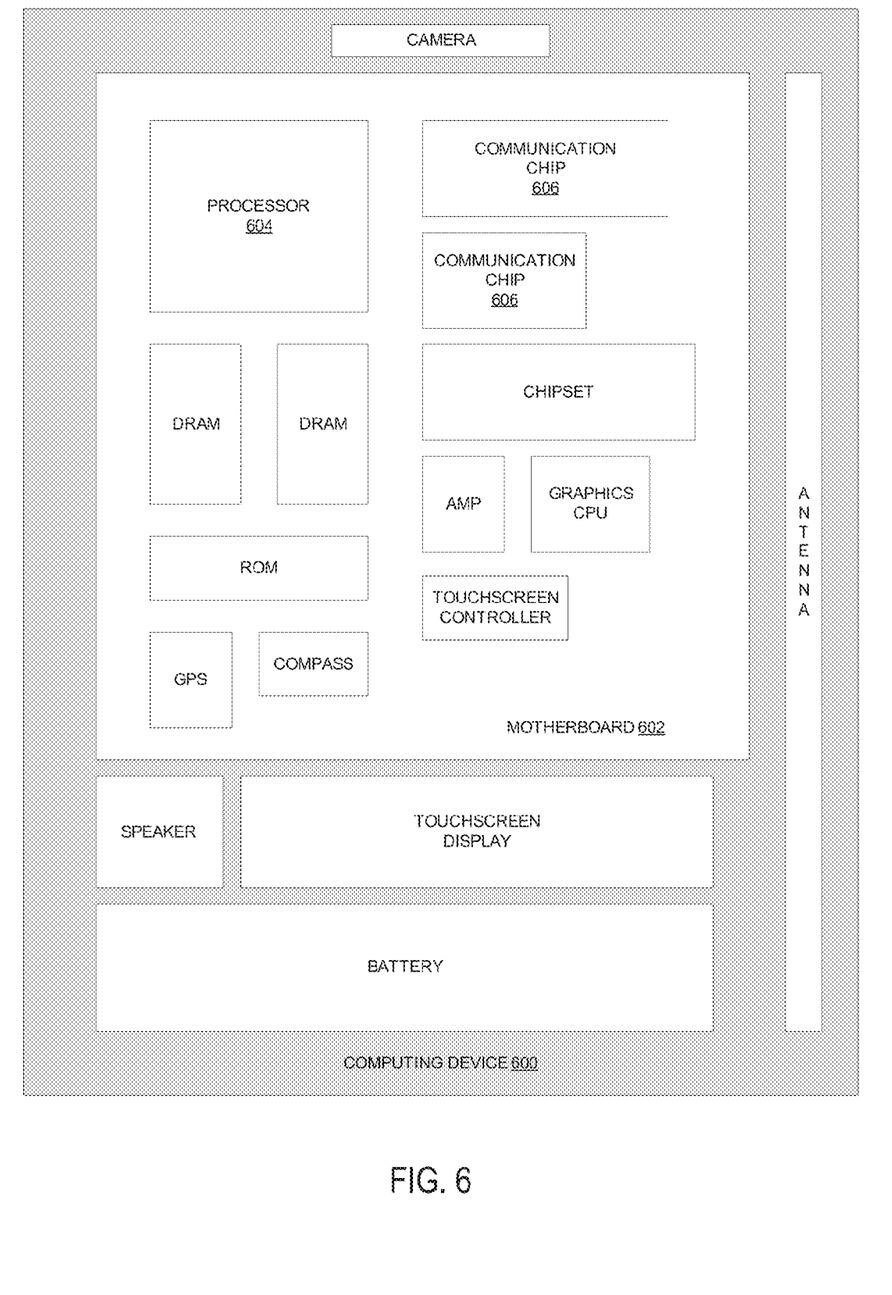
FIG. 6 schematically illustrates a computing device in accordance with one implementation of the invention.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired. FIG. 6 schematically illustrates a computing device 600 in accordance with one implementation of the invention. The computing device 600 may house a board such as motherboard 602. According to various embodiments, the motherboard 602 may be a circuit board (e.g., circuit board 120 of FIG. 1) having one or more passive devices (e.g., passive devices 116 of FIG. 1) integral to the circuit board as described herein. The motherboard 602 may include a number of components, including but not limited to a processor 604 and at least one communication chip 606. The processor 604 may be physically and electrically coupled to the motherboard 602. In some implementations, the at least one communication chip 606 may also be physically and electrically coupled to the motherboard 602. In further implementations, the communication chip 606 may be part of the processor 604. According to various embodiments, the processor 604, the communication chip 606 or other components (e.g., memory devices) described in connection with the computing device 600 may be in the form of one or more dies (e.g., die 102 of FIG. 1) as described herein. The one or more passive devices may be disposed in the motherboard 602 within a die shadow region (e.g., indicated by arrow 123 of FIG. 1) of the one or more dies.

Depending on its applications, computing device 600 may include other components that may or may not be physically and electrically coupled to the motherboard 602. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other embodiments.

The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 may include a die (e.g., die 102 of FIG. 1) in an IC package assembly (e.g., IC package assembly 100 of FIG. 1) as described herein. The term "processor" may refer to any device or portion of a device that processes electronic data from registers and/or memory to transform that electronic data into other electronic data that may be stored in registers and/or memory.

The communication chip 606 may also include a die (e.g., die 102 of FIG. 1) in an IC package assembly (e.g., IC package assembly 100 of FIG. 1) as described herein. In further implementations, another component (e.g., memory device or other integrated circuit device) housed within the computing device 600 may contain a die (e.g., die 102 of FIG. 1) in an IC package assembly (e.g., IC package assembly 100 of FIG. 1) as described herein.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. An apparatus comprising:
a circuit board comprising an epoxy laminate material and having a first surface and a second surface opposite to the first surface; and
a plurality of inductors integral to the circuit board, wherein individual inductors of the plurality of inductors have
an input terminal configured to couple with electrical power of a die,
an output terminal electrically coupled with the input terminal, and
electrical routing features disposed between the first surface and the second surface of the circuit board and coupled with the input terminal and the output terminal to route the electrical power between the input terminal and the output terminal, wherein the electrical routing features include vias that pass through the epoxy laminate material, wherein the input terminal includes a surface configured to receive a solder ball connection of a package assembly including the die, and wherein the individual inductors are in a staggered arrangement such that the input terminals of the individual inductors form a row and the output terminal of the individual inductors are disposed in an alternating manner on both sides of the row.

2. The apparatus of claim 1, wherein the circuit board comprises a solder resist layer having openings to expose the surface of the input terminal and the output terminal.

3. The apparatus of claim 2, wherein:
the input terminal and the output terminal are solder pads configured to receive respective solder ball connections of the package assembly;
the vias include a first plated through-hole (PTH) coupled with the input terminal and a second PTH coupled with the output terminal; and
the electrical routing features include a metal.

4. The apparatus of claim 1, wherein:
the electrical routing features of the inductor comprise a first layer having an input portion coupled with the input terminal and an output portion coupled with the output terminal; and
the input portion is electrically insulated from the output portion in a plane of the first layer.

5. The apparatus of claim 4, wherein the electrical routing features of the inductor further comprise:
a first via structure of the vias coupled with the input portion of the first layer;
a second via structure of the vias coupled with the output portion of the first layer; and
a second layer electrically coupled with the input portion of the first layer by the first via structure and electrically coupled with the output portion of the first layer by the second via structure.

6. The apparatus of claim 5, wherein the electrical routing features of the inductor further comprise:
one or more additional layers disposed between the first layer and the second layer, the one or more additional layers being electrically coupled with the input portion of the first layer by the first via structure and electrically coupled with the output portion of the first layer by the second via structure.

7. The apparatus of claim 4, wherein the input portion and the output portion of the individual inductors are plate structures having shapes that mate in close-proximity placement in the staggered arrangement.

8. A method comprising:
forming a circuit board comprising an epoxy laminate material and having a first surface and a second surface opposite to the first surface; and
forming a plurality of inductors integral to the circuit board as part of forming the circuit board, wherein individual inductors of the plurality of inductors have
an input terminal configured to couple with electrical power of a die,
an output terminal electrically coupled with the input terminal, and
electrical routing features disposed between the first surface and the second surface of the circuit board and coupled with the input terminal and the output terminal to route the electrical power between the input terminal and the output terminal, wherein the electrical routing features include vias that pass through the epoxy laminate material, wherein the input terminal includes a surface configured to receive a solder ball connection of a package assembly including the die, and wherein the individual inductors are in a staggered arrangement such that the input terminals of the individual inductors form a row and the output terminal of the individual inductors are disposed in an alternating manner on both sides of the row.

9. The method of claim 8, wherein forming the plurality of inductors comprises forming the electrical routing features by:
forming a first via structure of the vias through the epoxy laminate material of the circuit board; and
forming a second via structure through the epoxy laminate material of the circuit board.

10. The method of claim 9, wherein the first via structure and the second via structure are plated through-holes (PTHs).

11. The method of claim 9, wherein forming the plurality of inductors further comprises forming the electrical routing features by forming a first layer having an input portion and an output portion, the input portion being coupled with the first via structure and the output portion being coupled with the second via structure, and the input portion being electrically insulated from the output portion in a plane of the first layer.

12. The method of claim 11, wherein forming the plurality of inductors further comprises:
forming the input terminal on the input portion of the first layer; and
forming the output terminal on the output portion of the first layer.

13. The method of claim 12, wherein forming the circuit board comprises forming a solder resist layer having openings to expose the input terminal and the output terminal.

14. The method of claim 11, wherein forming the plurality of inductors further comprises forming the electrical routing features by forming a second layer, the second layer being electrically coupled with the input portion of the first layer by the first via structure and being electrically coupled with the output portion of the first layer by the second via structure.

15. The method of claim 14, wherein forming the electrical routing features further comprises forming one or more additional layers disposed between the first layer and the second layer, the one or more additional layers being electrically coupled with the input portion of the first layer by the first via structure and electrically coupled with the output portion of the first layer by the second via structure.

16. A system comprising:

a circuit board comprising an epoxy laminate material and having a first surface and a second surface opposite to the first surface, the circuit board including a plurality of inductors integral to the circuit board, wherein individual inductors of the plurality of inductors have an input terminal coupled with electrical power of a die, an output terminal electrically coupled with the input terminal, and electrical routing features disposed between the first surface and the second surface of the circuit board and coupled with the input terminal and the output terminal to route the electrical power between the input terminal and the output terminal wherein the electrical routing features include vias that pass through the epoxy laminate material, and wherein the individual inductors are in a staggered arrangement such that the input terminals of the individual inductors form a row and the output terminal of the individual inductors are disposed in an alternating manner on both sides of the row; and a package assembly including the die, the package assembly being coupled to the circuit board, wherein the input terminal includes a surface that is coupled to the package assembly by a solder ball.

17. The system of claim 16, wherein:

the individual inductors are disposed in a die shadow region of the circuit board;

the package assembly is coupled with the circuit board using solder balls; and the circuit board includes a solder resist layer having an opening corresponding with the input terminal.

18. The system of claim 16, wherein the electrical routing features comprise:

a first layer having an input portion coupled with the input terminal and an output portion coupled with the output terminal, the input portion being electrically insulated from the output portion in a plane of the first layer;

a first via structure of the vias coupled with the input portion of the first layer;

a second via structure of the vias coupled with the output portion of the first layer; and a second layer electrically coupled with the input portion of the first layer by the first via structure and electrically coupled with the output portion of the first layer by the second via structure.

19. The system of claim 18, wherein the electrical routing features of the passive device further comprise:

one or more additional layers disposed between the first layer and the second layer, the one or more additional layers being electrically coupled with the input portion of the first layer by the first via structure and electrically coupled with the output portion of the first layer by the second via structure.

* * * * *